United States Patent
Liu et al.

(10) Patent No.: US 12,411,409 B2
(45) Date of Patent: Sep. 9, 2025

(54) AROMATIC UNDERLAYER

(71) Applicant: Rohm and Haas Electronic Materials LLC, Marlborough, MA (US)

(72) Inventors: Sheng Liu, Bow, NH (US); James F. Cameron, Brookline, MA (US); Shintaro Yamada, Shrewsbury, MA (US); Iou-Sheng Ke, Andover, MA (US); Keren Zhang, Kirkland, WA (US); Daniel Greene, Louisville, KY (US); Paul J. LaBeaume, Auburn, MA (US); Li Cui, Westborough, MA (US); Suzanne M. Coley, Mansfield, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1002 days.

(21) Appl. No.: 17/245,326

(22) Filed: Apr. 30, 2021

(65) Prior Publication Data
US 2021/0247695 A1      Aug. 12, 2021

Related U.S. Application Data

(63) Continuation-in-part of application No. 16/598,264, filed on Oct. 10, 2019, now Pat. No. 12,099,300.

(60) Provisional application No. 63/019,336, filed on May 2, 2020, provisional application No. 62/754,752, filed on Nov. 2, 2018.

(51) Int. Cl.
G03F 7/11       (2006.01)
C09D 5/00       (2006.01)
G03F 7/075      (2006.01)

(52) U.S. Cl.
CPC ............... *G03F 7/11* (2013.01); *C09D 5/006* (2013.01); *G03F 7/0752* (2013.01)

(58) Field of Classification Search
CPC ......... C08G 61/10; G03F 7/11; G03F 7/0752; G03F 7/09; G03F 7/091; G03F 7/2016; H01L 21/02; H01L 21/027; H01L 21/033
See application file for complete search history.

(56) References Cited

U.S. PATENT DOCUMENTS

| | | | |
|---|---|---|---|
| 5,965,679 | A | 10/1999 | Godschlax et al. |
| 6,121,495 | A | 9/2000 | Babb et al. |
| 9,581,905 | B2 | 2/2017 | Nakafuji et al. |
| 2012/0018714 | A1 | 1/2012 | Yasukawa et al. |
| 2012/0100481 | A1 | 4/2012 | Ito et al. |
| 2018/0157175 | A1 | 6/2018 | Liu et al. |
| 2018/0158674 | A1 | 6/2018 | Yamada et al. |
| 2020/0142309 | A1 | 5/2020 | Liu et al. |

FOREIGN PATENT DOCUMENTS

| | | | | |
|---|---|---|---|---|
| JP | 2009162871 A | * | 7/2009 | |
| JP | 2009162871 A1 | | 7/2009 | |
| KR | 10-2010-0005995 A | | 1/2010 | |
| KR | 10-2019-0050531 A | | 5/2019 | |
| KR | 2019050531 A | * | 5/2019 | ............. G03F 7/091 |
| WO | 1997010193 A1 | | 3/1997 | |
| WO | 02/35580 A2 | | 5/2002 | |
| WO | 2004050231 A2 | | 6/2004 | |
| WO | 2014/033481 A2 | | 3/2014 | |

OTHER PUBLICATIONS

English Translation of KR 2019-050531 A; Chae Seung Yong; Published: May 13, 2019 (Year: 2019).*
English translation of JP 2009-162871 A; Fukushige Yuichi; Published Jul. 23, 2009 (Year: 2009).*
Smith, et al, "Polyarylene Networks via Bergman Cyclopolymerization of Bis-ortho-diynyl Arenes," Advanced Functional Materials, 2007, vol. 17, pp. 1237-1246.
Kobayashi, et al, "1,3,5-Tris(functionalised-phenylethynyl)benzene-metal complexes: synthetic survey of mesoporous coordination polymers and investigation of their carbonization," J. Mater. Chem. 2008, vol. 18, pp. 1037.
Kalidindi, Suresh B. et al., Chemical and Structural Stability of Zirconium-based Metal-Organic Frameworks with arge Three-Dimensional Pores by Linker Engineering, Angewandte Chemie, International Edition, 2015, vol. 54, pp. 221-226.
Auttapornpitak, Pharkphoom et al., Water-soluble branched phenyleneethynylene fluorophores with N-phenylcarbazole core, Sensors and Actuators B: Chemical, 2013, vol. 178, pp. 296-301.
Rodriguez, J. Gonzalo et al., Efficient synthesis of 3,3',5,5'-tetra(p-X-phenylethynyl)biphenyl (X: NMe2; OMe) by homocoupling of 1-bromo-3,5-di (p-X-phenylethynyl) benzene or by heterocoupling of 3,3',5,5'-tetraethynylbiphenyl with p-X-phenylbromobenzene with nickel or palladium complexes, respectively, Tetrahedron, 2009, vol. 65, pp. 2551-2555.
Search report for corresponding Taiwan Application No. 108139215 dated Oct. 14, 2024.

* cited by examiner

*Primary Examiner* — Mark F. Huff
*Assistant Examiner* — Richard David Champion
(74) *Attorney, Agent, or Firm* — Jonathan D. Baskin

(57) ABSTRACT

Compounds having three or more alkynyl moieties substituted with an aromatic moiety having one or more of certain substituents are useful in forming underlayers useful in semiconductor manufacturing processes.

13 Claims, No Drawings

AROMATIC UNDERLAYER

This is a continuation-in-part of application Ser. No. 16/598,264 filed on Oct. 10, 2019, which claims priority from Provisional Application No. 62/754,752 filed on Nov. 2, 2018. This application also claims priority to Provisional Application No. 63/019,336 filed on May 2, 2020.

The present invention relates generally to the field of manufacturing electronic devices, and more specifically to the field of materials for use as underlayers in semiconductor manufacture.

It is well-known in lithographic processes that a resist pattern can collapse due to surface tension from the developer used if the resist pattern is too tall (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, such as different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

The incumbent technologies for underlayer include chemical vapor deposited (CVD) carbon and solution processed high-carbon content polymers. The CVD materials have several significant limitations including high cost of ownership, inability to form a planarizing layer over topography on a substrate, and high absorbance at 633 nm which is used for pattern alignment. For these reasons, the industry has been moving to solution processed high-carbon content materials as underlayers. The ideal underlayer needs to meet the following properties: capable of being cast onto a substrate by a spin-coating process, thermal-set upon heating with low out-gassing and sublimation, soluble in common processing solvents for good equipment compatibility, have appropriate n and k values to work in conjunction with currently used silicon hardmask and bottom antireflectant (BARC) layers to impart low reflectivity necessary for photoresist imaging, and be thermally stable up to >400° C. so as to not be damaged during subsequent silicon-oxy-nitride (SiON) CVD processes.

It is well-known that materials of relatively low molecular weight have relatively low viscosity, and flow into features in a substrate, such as vias and trenches, to afford planarizing layers. Underlayer materials must be able to planarize with relatively low out-gassing up to 400° C. For use as a high-carbon content underlayer, it is imperative for any composition to be thermally set upon heating. U.S. Pat. No. 9,581,905 B2 discloses compounds of the formula

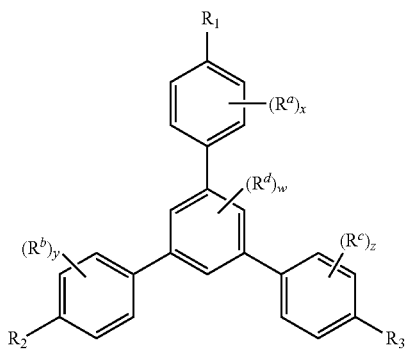

where $R_1$, $R_2$ and $R_3$ each independently represent the formula $R^A$—C≡C—$R^B$—, where $R^A$ can be, inter alia, an aryl group substituted with at least one of a hydroxyl group and an aryl group, and $R^B$ is a single bond or an aryl group, where such compounds are useful in forming underlayers in the manufacture of semiconductor devices. Such compounds cure at relatively high temperatures. There remains a need for materials that cure at relatively lower temperatures and that are useful for forming underlayers in semiconductor manufacturing processes.

The present invention provides a method comprising: (a) providing an electronic device substrate; (b) coating a layer of a coating composition comprising one or more curable compounds on a surface of the electronic device substrate, wherein the one or more curable compounds comprise an aromatic core chosen from a $C_{5-6}$ aromatic ring and a $C_{9-30}$ fused aromatic ring system and three or more substituents of formula (1)

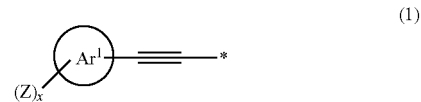

(1)

wherein at least two substituents of formula (1) are attached to the aromatic core; and wherein $Ar^1$ is an aromatic ring or fused aromatic ring system having from 5 to 30 carbons; Z is a substituent chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to 4; and * denotes the point of attachment to the aromatic core; provided that no substituents of formula (1) are in an ortho position to each other on the same ring of the aromatic core; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate.

Also provided by the present invention is an electronic device comprising an electronic device substrate having a layer of a polymer comprising as polymerized units one or more curable compounds on a surface of the electronic device substrate, wherein the one or more curable compounds comprise an aromatic core chosen from a $C_{5-6}$ aromatic ring and a $C_{9-30}$ fused aromatic ring system and three or more substituents of formula (1)

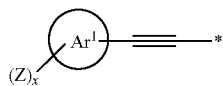
(1)

wherein at least two substituents of formula (1) are attached to the aromatic core; and wherein $Ar^1$ is an aromatic ring or fused aromatic ring system having from 5 to 30 carbons; Z is a substituent chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to 4; and * denotes the point of attachment to the aromatic core; provided that no substituents of formula (1) are in an ortho position to each other on the same ring of the aromatic core.

The present invention further provides a compound of formula (2)

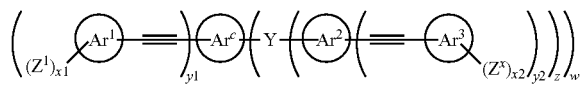
(2)

wherein $Ar^c$ is an aromatic core having from 5 to 30 carbon atoms; $Ar^1$, $Ar^2$, and $Ar^3$ are each independently an aromatic ring or fused aromatic ring system having from 5 to 30 carbons; Y is a single covalent chemical bond, a divalent linking group, or a trivalent linking group; $Z^1$ and $Z^2$ are independently a substituent chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x1=1 to 4; x2=1 to 4; y1=2 to 4; each y2=0 to 4; y1+each y2≥3; w=0 to 2; and z equals 0 to 2; wherein z=1 when Y is a single covalent chemical bond or a divalent linking group; and z=2 when Y is a trivalent linking group; provided that $Ar^c$ and each $Ar^1$ are not phenyl when w=0.

Still further, the present invention provides a method comprising: (a) providing an electronic device substrate; (b) coating a layer of a coating composition comprising one or more curable compounds of formula (2)

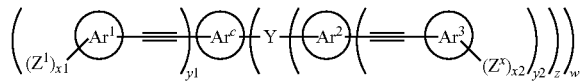
(2)

wherein $Ar^c$ is an aromatic core having from 5 to 30 carbon atoms; $Ar^1$, $Ar^2$, and $Ar^3$ are each independently an aromatic ring or fused aromatic ring system having from 5 to 30 carbons; Y is a single covalent chemical bond, a divalent linking group, or a trivalent linking group; $Z^1$ and $Z^2$ are independently a substituent chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x1=1 to 4; x2=1 to 4; y1=2 to 4; each y2=0 to 4; y1+each y2≥3; w=0 to 2; and z equals 0 to 2; wherein z=1 when Y is a single covalent chemical bond or a divalent linking group; and z=2 when Y is a trivalent linking group on a surface of the electronic device substrate; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate.

Also provided by the present invention is a process for filling a gap (or aperture), comprising: (a) providing a semiconductor substrate having a relief image on a surface of the substrate, the relief image comprising a plurality of gaps to be filled; (b) applying a coating layer of one or more compounds of formula (2) over the relief image; and (c) heating the coating layer at a temperature sufficient to cure the coating layer.

It will be understood that when an element is referred to as being "on" another element, it can be directly adjacent to the other element or intervening elements may be present therebetween. In contrast, when an element is referred to as being "directly on" another element, there are no intervening elements present. As used herein, the term "and/or" includes any and all combinations of one or more of the associated listed items.

It will also be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; L=liter; mL=milliliter; A=angstrom; nm=nanometer; m=micron=micrometer; mm=millimeter; sec.=second; min.=minute; hr.=hour; DI=deionized; and Da=dalton. "Wt %" refers to percent by weight based on the total weight of a referenced composition, unless otherwise specified. Unless otherwise specified, all amounts are wt % and all ratios are molar ratios. All numerical ranges are inclusive and combinable in any order, except where it is clear that such numerical ranges are constrained to add up to 100%. The articles "a", "an" and "the" refer to the singular and the plural. "Alkyl" refers to linear, branched and cyclic alkyl unless otherwise specified. As used herein, "alkyl" refers to an alkane radical, and includes alkane monoradicals, diradicals (alkylene), and higher-radicals. "Halo" refers to fluoro, chloro, bromo, and iodo. Unless otherwise noted, "alkyl" includes "heteroalkyl". The term "heteroalkyl" refers to an alkyl group with one or more heteroatoms, such as nitrogen, oxygen, sulfur, phosphorus, replacing one or more carbon atoms within the radical, for example, as in an ether or a thioether. In one preferred embodiment, "alkyl" does not include "heteroalkyl". If no number of carbons is indicated for any alkyl or heteroalkyl, then 1-12 carbons are contemplated.

"Aryl" includes aromatic carbocycles and aromatic heterocycles. The term "aryl" refers to an aromatic radical, and includes monoradicals, diradicals (arylene), and higher-radicals. It is preferred that aryl moieties are aromatic carbocycles. "Substituted aryl" refers to any aryl moiety having one or more of its hydrogens replaced with one or more substituents chosen from halogen, $C_{1-6}$-alkyl, halo-$C_{1-6}$-alkyl, $C_{1-6}$-alkoxy, halo-$C_{1-6}$-alkoxy, phenyl, and phenoxy, preferably from halogen, $C_{1-6}$-alkyl, halo-$C_{1-4}$-alkyl, $C_{1-6}$-alkoxy, halo-$C_{1-4}$-alkoxy, and phenyl, and more preferably from halogen, $C_{1-6}$-alkyl, $C_{1-6}$-alkoxy, phenyl, and phenoxy. Preferably, a substituted aryl has from 1 to 3 substituents, and more preferably 1 or 2 substituents. As used herein, the term "polymer" includes oligomers. The term "oligomer" refers to dimers, trimers, tetramers and other polymeric materials that are capable of further curing. By the term "curing" is meant any process, such as polymerization or condensation, that increases the overall molecular weight of the present resins, removes solubility enhancing groups from the present oligomers, or both increases the overall molecular weight and removes solubility enhancing groups. "Curable" refers to any material capable of being cured under certain conditions. As used herein, "gap" refers to any aperture on a semiconductor substrate that is intended to be filled with a gap-filling composition.

Aromatic underlayers are formed in the manufacture of electronic devices according to a method comprising: (a) providing an electronic device substrate; (b) coating a layer of a coating composition comprising one or more curable compounds on a surface of the electronic device substrate, wherein the one or more curable compounds comprise an aromatic core chosen from a $C_{5-6}$ aromatic ring and a $C_{9-30}$ fused aromatic ring system and three or more substituents of formula (1)

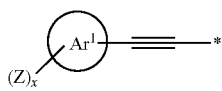
(1)

wherein at least two substituents of formula (1) are attached to the aromatic core; and wherein $Ar^1$ is an aromatic ring or fused aromatic ring system having from 5 to 30 carbons; Z is chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to 4; and * denotes the point of attachment to the aromatic core; provided that no substituents of formula (1) are in an ortho position to each other on the same ring of the aromatic core; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate. Next, the substrate is patterned, and the patterned underlayer is removed. In one preferred embodiment, a layer of photoresist is coated directly on the underlayer. In an alternate preferred embodiment, a layer of one or more of a silicon-containing composition, an organic antireflective composition (BARC), and a combination thereof is coated directly on the underlayer before step (d) to form a middle layer and a layer of photoresist is coated directly on the middle layer. When a silicon-containing middle layer is used, the pattern is transferred to the silicon-containing middle layer after step (f) and before step (g).

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like, with semiconductor wafers being preferred. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

Optionally, a layer of an adhesion promoter may be applied to the substrate surface before the deposition of the present coating compositions, which is subsequently cured to form the underlayer. If an adhesion promoter is desired, any suitable adhesion promoter for polymer films may be used, such as silanes, preferably organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from Dow Electronic Materials (Marlborough, Massachusetts).

Coating compositions useful in the present invention comprise one or more curable compounds comprising an aromatic core chosen from a $C_{5-6}$ aromatic ring and a $C_{9-30}$ fused aromatic ring system and three or more substituents of formula (1)

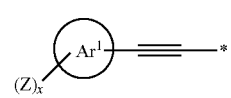
(1)

wherein at least two substituents of formula (1) are attached to the aromatic core; and wherein $Ar^1$ is an aromatic ring or fused aromatic ring system having from 5 to 30 carbons; Z is chosen from $OR^1$, protected hydroxyl, carboxyl, protected carboxyl, $SR^1$, protected thiol, —O—C(=O)—$C_{1-6}$-alkyl, halogen, and NHR², each R¹ is chosen from H, C₁₋₁₀-alkyl, C₂₋₁₀-unsaturated hydrocarbyl, and C₅₋₃₀-aryl; each R² is chosen from H, C₁₋₁₀-alkyl, C₂₋₁₀-unsaturated hydrocarbyl, C₅₋₃₀-aryl, C(=O)—R¹, and S(=O)₂—R¹; x is an integer from 1 to 4; and * denotes the point of attachment to the aromatic core; provided that no substituents of formula (1) are in an ortho position to each other on the same ring of the aromatic core. Thus, substituents of formula (1) bonded to the same aromatic ring of the core will not be bonded to immediately adjacent carbon atoms of the aromatic ring, for example, at positions 1 and 2 of a benzene core. It is preferred that each Z is independently chosen from OR¹, protected hydroxyl, carboxyl (C(=O)OH), protected carboxyl, SH, fluorine, and NHR². More preferably, each Z is independently chosen from hydroxyl (OH), protected hydroxyl, OCH₂C≡CH, C(=O)OH, protected carboxyl, and NHR², yet more preferably from OH, protected hydroxyl, OCH₂C≡CH, carboxyl, and protected carboxyl, and still more preferably from OH and protected hydroxyl. Each R¹ is independently chosen from H, C₁₋₁₀ alkyl, C₂₋₁₀ unsaturated hydrocarbyl, and C₅₋₃₀ aryl, and more preferably from H, C₁₋₁₀-alkyl, C₂₋₁₀-alkenyl, C₂₋₁₀-alkynyl, and C₅₋₃₀ aryl. In one preferred embodiment, R¹ is H. Preferably, R² is chosen from H, C₁₋₁₀-alkyl, C₂₋₁₀-unsaturated hydrocarbyl, and C₅₋₃₀-aryl, and more preferably from H, C₁₋₁₀-alkyl, C₂₋₁₀-alkenyl and C₂₋₁₀-alkynyl. As used herein, the term "aromatic core" refers to a single aromatic ring or a fused aromatic ring system to which at least two moieties of formula (1) are attached. The aromatic core may optionally be substituted with one or more substituents chosen from C₁₋₂₀-aliphatic or cycloaliphatic moiety and C₅₋₃₀-aryl moiety. Preferably, the aromatic core is chosen from pyridine, benzene, naphthalene, quinoline, isoquinoline, carbazole, anthracene, phenanthrene, pyrene, coronene, triphenylene, chrysene, phenalene, benz[a]anthracene, dibenz[a,h]anthracene, and benzo[a]pyrene, more preferably from benzene, naphthalene, carbazole, anthracene, phenanthrene, pyrene, coronene, triphenylene, chrysene, phenalene, benz[a]anthracene, dibenz[a,h]anthracene, and benzo[a]pyrene, and still more preferably from benzene, naphthalene, anthracene, phenanthrene, pyrene, coronene, triphenylene, chrysene, and phenalene. In formula (1), it is preferred that each Ar¹ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene, more preferably from benzene, naphthalene, anthracene, phenanthrene, pyrene, coronene, triphenylene, chrysene, phenalene, benz[a]anthracene, dibenz[a,h]anthracene, and benzo[a]pyrene, and even more preferably from benzene, naphthalene, anthracene, phenanthrene, pyrene, coronene, triphenylene, chrysene, and phenalene. It is preferred that x=1 or 2, and more preferably x=1. The present curable compounds have at least three moieties of formula (1) wherein at least two substituents of formula (1) are attached directly to the aromatic core. The present curable compounds may have any suitable number of the moieties of formula (1) such as from 3 to 10, preferably 3 to 8, more preferably from 3 to 6, and even more preferably 3 or 4. It is further preferred that the present curable compounds have from 2 to 4 moieties of formula (1) attached directly to the aromatic core.

In one embodiment, preferred curable compounds useful in the present coating compositions are those of formula (2)

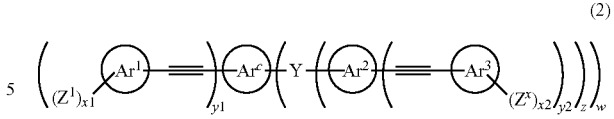

(2)

wherein Ar^c is an aromatic core having from 5 to 30 carbon atoms; Ar¹, Ar², and Ar³ are each independently an aromatic ring or fused aromatic ring system having from 5 to 30 carbons; Y is a single covalent chemical bond, a divalent linking group, or a trivalent linking group; Z¹ and Z² are independently chosen from OR¹, protected hydroxyl, carboxyl, protected carboxyl, SR¹, protected thiol, —O—C(=O)—C₁₋₆-alkyl, halogen, and NHR²; each R¹ is chosen from H, C₁₋₁₀ alkyl, C₂₋₁₀ unsaturated hydrocarbyl, and C₅₋₃₀ aryl; each R² is chosen from H, C₁₋₁₀ alkyl, C₂₋₁₀ unsaturated hydrocarbyl, C₅₋₃₀ aryl, C(=O)—R¹, and S(=O)₂—R¹; x1=1 to 4; x2=1 to 4; y1=2 to 4; each y2=0 to 4; y1+each y2≥3; w=0 to 2; and z equals 0 to 2; wherein z=1 when Y is a single covalent chemical bond or a divalent linking group; and z=2 when Y is a trivalent linking group. It is preferred that Ar^c is an aromatic core having from 5 to 25 carbon atoms, and more preferably from 5 to 20 carbon atoms. Suitable aromatic cores for Ar^c include, without limitation, pyridine, benzene, naphthalene, quinoline, isoquinoline, carbazole, anthracene, phenanthrene, pyrene, coronene, triphenylene, chrysene, phenalene, benz[a]anthracene, dibenz[a,h]anthracene, and benzo[a]pyrene, preferably benzene, naphthalene, carbazole, anthracene, phenanthrene, pyrene, coronene, triphenylene, chrysene, phenalene, benz[a]anthracene, dibenz[a,h]anthracene, and benzo[a]pyrene, and more preferably benzene, naphthalene, anthracene, phenanthrene, pyrene, coronene, triphenylene, chrysene, and phenalene. It is preferred that Ar¹ is chosen from benzene, pyridine, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene. More preferably, each of Ar¹, Ar², and Ar³ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene, more preferably from benzene, naphthalene, anthracene, phenanthrene, pyrene, coronene, triphenylene, chrysene, phenalene, benz[a]anthracene, dibenz[a,h]anthracene, and benzo[a]pyrene, and yet more preferably from benzene, naphthalene, anthracene, phenanthrene, pyrene, coronene, triphenylene, chrysene, and phenalene. It is further preferred that Ar^c is chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene, and each of Ar¹, Ar², and Ar³ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene. It is preferred that each Z¹ and Z² are independently chosen from chosen from OR¹, protected hydroxyl, carboxyl (C(=O)OH), protected carboxyl, SH, fluorine, NHR², more preferably from hydroxyl (OH), protected hydroxyl, OCH₂C≡CH, C(=O)OH, protected carboxyl, and NHR², yet more preferably from OH, protected hydroxyl, OCH₂C≡CH, carboxyl, and protected carboxyl, and still more preferably from OH and protected hydroxyl. Each R¹ is independently chosen from H, $C_{1-10}$ alkyl, $C_{2-10}$ unsaturated hydrocarbyl, and $C_{5-30}$ aryl, and more preferably from H, $C_{1-10}$-alkyl, $C_{2-10}$-alkenyl, $C_{2-10}$-alkynyl, and $C_{5-30}$ aryl. In one preferred embodiment, $R^1$ is H. Preferably, $R^2$ is chosen from H, $C_{1-10}$-alkyl, $C_{2-10}$-unsaturated hydrocarbyl, and $C_{5-30}$-aryl, and more preferably from H, $C_{1-10}$-alkyl, $C_{2-10}$-alkenyl and $C_{2-10}$-alkynyl. It is preferred that each $Z^1$ is the same. It is also preferred that each $Z^2$ is the same. It is further preferred that $Z^1=Z^2$. It is preferred that each of x1 and x2 are independently chosen from 1 to 3, more preferably are independently 1 or 2, and yet more preferably are each 1. Preferably, each y2=0 to 2. It is preferred that y1+each y2=3 to 8, more preferably 3 to 6, and yet more preferably 3 or 4. Preferably, w=0 to 1. In one preferred embodiment, none of the substituents containing $Ar^1$ and $Ar^3$ are in an ortho position to each other on the same ring of the aromatic core. In one preferred embodiment, $Ar^c$ and each $Ar^1$ are not phenyl when w=0. In one preferred embodiment, Y is a single covalent bond. In another preferred embodiment, Y is a divalent or trivalent linking group. Exemplary linking groups for Y include, but are not limited to, O, S, $N(R^3)_r$, $S(=O)_2$, $CR^4R^5$, a bis-imide moiety, a bis-etherimide moiety, a bis-ketoimide moiety, a bis-benzoxazole moiety, a bis-benzimidazole moiety, and a bis-benzothiazole moiety, wherein r=0 or 1, and preferably linking groups for Y are O, $N(R^3)_w$, and $CR^4R^5$. $R^3$ is —C(=O)—$C_{5-30}$-aryl or —S(=O)$_2$—$C_{5-30}$-aryl, wherein ** is the point of attachment to N. $R^4$ and R are independently chosen from H, $C_{1-10}$-alkyl and $C_{5-10}$-aryl, and $R^4$ and $R^4$ may be taken together along with the carbon to which they are attached to form a 5- or 6-membered ring which may be fused to one or more aromatic rings. One suitable linking group when $Y=CR^4R^5$ is a fluorenyl moiety of the following formula (A)

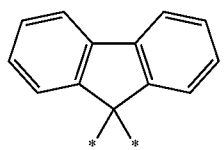

(A)

wherein * denotes the point of attachment to $Ar^c$ and $Ar^2$. A suitable bis-imide moiety linking group for Y is shown by formula (B) and formula (C) where $Y^1$ is a single covalent bond or a $C_{5-30}$-arylene, wherein * denotes the point of attachment to $Ar^c$ and $Ar^2$. Suitable bis-etherimide and bis-ketoimide moieties are those of formula (C) wherein $Y^1=O$ or —C(=O)—, respectively, and wherein * denotes the point of attachment to $Ar^c$ and $Ar^2$. Suitable bis-benzoxazole, bis-benzimidazole, and bis-benzothiazole moieties are those of formula (D), wherein G=O, NH, and S, respectively, and wherein $Y^2$ is a single covalent bond or a $C_{5-30}$-arylene, and wherein * denotes the point of attachment to $Ar^c$ and $Ar^2$.

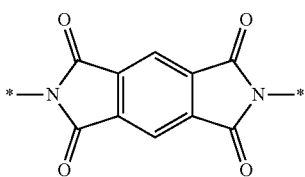

(B)

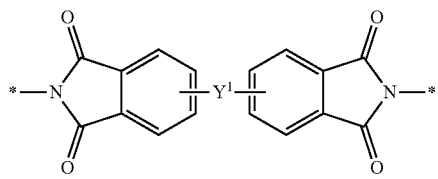

(C)

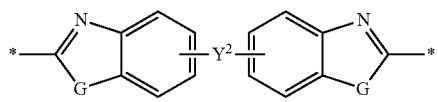

(D)

Protected carboxyl groups for Z, $Z^1$ and $Z^2$ of formulas (1) and (2) are any group which is cleavable under certain conditions to yield a carboxyl group. Such protected carboxyl groups may be cleaved by heat, acid, base or a combination thereof, preferably by heat, acid or a combination thereof, and more preferably by heat. Exemplary protected carboxyl groups include esters, such as benzyl esters and esters having a quaternary carbon bonded directly to the alkoxy oxygen of the ester group. It is preferred that the protected carboxyl group is an ester having a quaternary carbon bonded directly to the alkoxy oxygen of the ester group, and more preferably the ester has the formula Y—C(O)—O—$CR^1R'R'''$, where Y is an organic residue, and each of $R^1$, R' and R''' are independently chosen from $C_{1-10}$alkyl. Preferred protected carboxyl groups include: tert-butyl esters; 1-allylcyclopentyl esters such as 1-methylcyclopentyl esters and 1-ethylcyclopentyl esters; 2,3-dimethyl-2-butyl esters; 3-methyl-3-pentyl esters; 2,3,3-trimethyl-3-butyl esters; 1,2-dimethylcyclopentyl esters; 2,3,4-trimethyl-3-pentyl esters; 2,2,3,4,4-pentamethyl-3-pentyl esters; and adamantyl esters such as hydroxyadamantyl esters and $C_{1-12}$alkyladamantyl esters. Each of the aforementioned protected carboxyl groups can be cleaved by one or more of heat, acid or base. Preferably, the protected carboxyl groups are cleaved using heat, acid or a combination of heat and acid, and more preferably by heat. For example, these protected carboxyl groups can be cleaved at a pH of ≤4 and preferably ≤1. Such protected carboxyl groups may be cleaved at room temperature when in exposed to a pH in the range of 1 to 4. When the pH is <1, such protected carboxyl groups are typically heated to approximately 90 to 110° C., and preferably to approximately 100° C. Alternatively, when the protected carboxyl group is an ester having a quaternary carbon bonded directly to the alkoxy oxygen of the ester group, it can be cleaved by heating to a suitable temperature, such as ≥125° C., preferably from 125 to 250° C., and more preferably from 150 to 250° C. Such protected carboxyl groups, and their conditions of use, are well-known in the art, such as U.S. Pat. No. 6,136,501, which discloses various ester groups having a quaternary carbon bonded directly to the alkoxy oxygen of the ester group.

Protected hydroxyl groups suitable for Z, $Z^1$ and $Z^2$ of formulas (1) and (2) are any group which is cleavable under certain conditions to yield a hydroxyl group. Such protected hydroxyl groups may be cleaved by heat, acid, base or a combination thereof. Exemplary protected hydroxyl groups include: ethers such as methoxymethyl ethers, tetrahydropyranyl ethers, tert-butyl ethers, allyl ethers, benzyl ethers, tert-butyldimethylsilyl ethers, tert-butyldiphenylsilyl ethers, acetonides, and benzylidene acetals; esters such as pivalic acid esters and benzoic acid esters; and carbonates such as tert-butylcarbonate. Each of the aforementioned protected hydroxyl groups can be cleaved under acidic or alkaline conditions, and preferably under acidic conditions. More preferably, the protected hydroxyl groups are cleaved using acid or a combination of acid and heat. For example, these protected hydroxyl groups can be cleaved at a pH of ≤4 and preferably ≤1. Such protected hydroxyl groups may be cleaved at room temperature when exposed to a pH in the range of 1 to 4. When the pH is <1, such protected hydroxyl groups are typically heated to approximately 90 to 110° C., and preferably to approximately 100° C. Such protected hydroxyl groups, and their conditions of use, are well-known in the art.

Protected thiol groups suitable for Z, $Z^1$ and $Z^2$ of formulas (1) and (2) are any group which is cleavable under certain conditions to yield a thiol group. Such protected thiol groups may be cleaved by heat, acid, base or a combination thereof. Exemplary protected thiol groups include: ethers such as methoxymethyl thioethers, tetrahydropyranyl thioethers, tert-butyl thioethers, allyl thioethers, benzyl thioethers, tert-butyldimethylsilyl thioethers, tert-butyldiphenylsilyl thioethers, thioacetonides, and benzylidene thioacetals; thioesters such as pivalic acid thioesters and benzoic acid thioesters; and thiocarbonates such as tert-butylthiocarbonate. Each of the aforementioned protected thiol groups can be cleaved under acidic or alkaline conditions, and preferably under acidic conditions. More preferably, the protected thiol groups are cleaved using acid or a combination of acid and heat. For example, these protected thiol groups can be cleaved at a pH of ≤4 and preferably ≤1. Such thiol groups may be cleaved at room temperature when exposed to a pH in the range of 1 to 4. When the pH is <1, such protected thiol groups are typically heated to approximately 90 to 110° C., and preferably to approximately 100° C. Such protected thiol groups, and their conditions of use, are well-known in the art.

In addition to the one or more curable compounds described above, the present coating compositions may optionally comprise, and preferably do comprise, one or more organic solvents. Suitable organic solvents are any that dissolve the one or more curable compounds, and preferably are organic solvents conventionally used in the manufacture of electronic devices. Organic solvents may be used alone or a mixture of organic solvents may be used. Suitable organic solvents include, but are not limited to; ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol methyl ether (PGME), propylene glycol ethyl ether (PGEE), ethylene glycol monomethyl ether, propylene glycol monoethyl ether, ethylene glycol monoethyl ether, propylene glycol dimethyl ether, and diethylene glycol dimethyl ether, anisole; esters such as propylene glycol monomethyl ether acetate (PGMEA), propylene glycol monoethyl ether acetate, ethyl lactate (EL), methyl hydroxyisobutyrate (HBM), ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as gamma-butyrolactone; and any combination of the foregoing. Preferred solvents are PGME, PGEE, PGMEA, EL, HBM, and combinations thereof.

The present coating compositions may also comprise one or more coating additives that are typically used in such coatings, such as curing agents, crosslinking agents, surface leveling agents, and the like. The selection of such optional additives and their amounts are well within the ability of those skilled in the art. Curing agents are typically present in an amount of from 0 to 20 wt % based on total solids, and preferably from 0 to 3 wt %. Crosslinking agents are typically used in an amount of from 0 to 30 wt % based on total solids, and preferably from 3 to 10 wt %. Surface leveling agents are typically used in an amount of from 0 to 5 wt % based on total solids, and preferably from 0 to 1 wt %. The selection of such optional additives and their amounts used are within the ability of those skilled in the art.

Curing agents may optionally be used in the coating compositions to aid in the curing of the deposited curable compound. A curing agent is any component which causes curing of the curable compound on the surface of the substrate. Preferred curing agents are acids and thermal acid generators. Suitable acids include, but are not limited to: arylsulfonic acids such as p-toluenesulfonic acid; alkyl sulfonic acids such as methanesulfonic acid, ethanesulfonic acid, and propanesulfonic acid; perfluoroalkylsulfonic acids such as trifluoromethanesulfonic acid; and perfluoroarylsulfonic acids. A thermal acid generator is any compound which liberates acid upon exposure to heat. Thermal acid generators are well-known in the art and are generally commercially available, such as from King Industries, Norwalk, Connecticut. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators.

Any suitable crosslinking agent may be used in the present compositions, provided that such crosslinking agent has at least 2, and preferably at least 3, moieties capable of reacting with the present aromatic resin reaction products under suitable conditions, such as under acidic conditions. Exemplary crosslinking agents include, but are not limited to, novolac resins, epoxy-containing compounds, melamine compounds, guanamine compounds, isocyanate-containing compounds, benzocyclobutenes, and the like, and preferably any of the foregoing having 2 or more, preferably 3 or more, and more preferably 4, substituents selected from methylol, $C_1$-$C_{10}$alkoxymethyl, and $C_2$-$C_{10}$acyloxymethyl. Examples of suitable crosslinking agents are those shown by formulae (3) and (4).

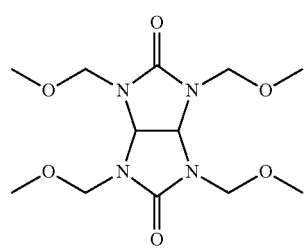

(3)

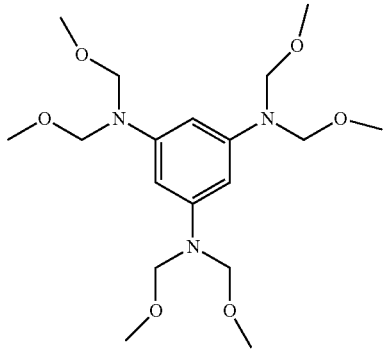

(4)

Such crosslinking agents are well-known in the art, and are commercially available from a variety of sources.

The present coating compositions may optionally include one or more surface leveling agents (or surfactants). While any suitable surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages.

The present coating compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the coating composition on the electronic device substrate. It will be appreciated by those skilled in the art that the height of the coating composition layer may be adjusted by changing the spin speed.

After being coated on the substrate, the coating composition layer is optionally baked at a relatively low temperature to remove any organic solvent and other relatively volatile components from the layer. Typically, the substrate is baked at a temperature of 80 to 150° C., although other suitable temperatures may be used. The baking time is typically from 10 seconds to 10 minutes, and preferably from 30 seconds to 5 minutes, although longer or shorter times may be used. When the substrate is a wafer, such baking step may be performed by heating the wafer on a hot plate. Following solvent removal, a layer, film or coating of the curable compound on the substrate surface is obtained.

The curable compound layer is then sufficiently cured to form an aromatic underlayer such that the film does not intermix with a subsequently applied coating layer, such as a photoresist or other layer coated directly on the aromatic underlayer. The underlayer may be cured in an oxygen-containing atmosphere, such as air, or in an inert atmosphere, such as nitrogen, and preferably in an oxygen-containing atmosphere. The curing conditions used are those sufficient to cure the film such that it does not intermix with a subsequently applied organic layer, such as a photoresist layer, while still maintaining the desired antireflective properties (n and k values) and etch selectivity of the underlayer film. This curing step is conducted preferably on a hot plate-style apparatus, though oven curing may be used to obtain equivalent results. Typically, such curing is performed by heating the underlayer at a curing temperature of ≥150° C., preferably ≥170° C., and more preferably ≥200° C. The curing temperature selected should be sufficient to cure the aromatic underlayer. A suitable temperature rage for curing the aromatic underlayer is 150 to 400° C., preferably from 170 to 350° C., and more preferably from 200 to 250° C. Such curing step may take from 10 sec. to 10 min., preferably from 1 to 3 min., and more preferably from 1 to 2 min., although other suitable times may be used.

The initial baking step may not be necessary if the curing step is conducted in such a way that rapid evolution of the solvents and curing by-products is not allowed to disrupt the underlayer film quality. For example, a ramped bake beginning at relatively low temperatures and then gradually increasing to a temperature of ≥200° C. can give acceptable results. It can be preferable in some cases to have a two-stage curing process, with the first stage being a lower bake temperature of less than 150° C., and the second stage being a higher bake temperature of ≥200° C. Two stage curing processes facilitate uniform filling and planarization of pre-existing substrate surface topography, for example filling of trenches and vias.

After curing of the underlayer, one or more processing layers, such as photoresists, silicon-containing layers, hardmask layers, bottom antireflective coating (or BARC) layers, and the like, may be coated on the cured underlayer. For example, a photoresist may be coated, such as by spin coating, directly on the surface of a silicon-containing layer or other middle layer which is directly on the resin underlayer, or, alternatively, the photoresist may be coated directly on the cured underlayer. A wide variety of photoresists may be suitably used, such as those used in 193 nm lithography, such as those sold under the EPIC™ brand available from Dow Electronic Materials (Marlborough, Massachusetts). Suitable photoresists may be either positive tone development or negative tone development resists. Following coating, the photoresist layer is then imaged (exposed) using patterned actinic radiation, and the exposed photoresist layer is then developed using the appropriate developer to provide a patterned photoresist layer. The pattern is next transferred from the photoresist layer to the underlayers by an appropriate etching techniques. Typically, the photoresist is also removed during such etching step. Next, the pattern is transferred to the substrate and the underlayer removed by appropriate etching techniques known in the art, such as by plasma etching. Following patterning of the substrate, the underlayer is removed using conventional techniques. The electronic device substrate is then processed according to conventional means.

The cured underlayer may be used as the bottom layer of a multilayer resist process. In such a process, a layer of the coating composition is coated on a substrate and cured as described above. Next, one or more middle layers are coated on the aromatic underlayer. For example, a silicon-containing layer or a hardmask layer is coated directly on the aromatic underlayer. Exemplary silicon-containing layers, such as a silicon-BARC, may be deposited by spin coating on the underlayer followed by curing, or an inorganic silicon layer such as SiON or $SiO_2$ may be deposited on the underlayer by chemical vapor deposition (CVD). Any suitable hardmask may be used and may be deposited on the underlayer by any suitable technique, and cured as appropriate. Optionally, an organic BARC layer may be disposed directly on the silicon-containing layer or hardmask layer, and appropriately cured. Next, a photoresist, such as those used in 193 nm lithography, is coated directly on the silicon-containing layer (in a trilayer process) or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the aromatic underlayer is then patterned using appropriate etching techniques, such as $O_2$ or $CF_4$ plasma. Any remaining patterned photoresist and organic BARC layers are removed during etching of the aromatic underlayer. Next, the pattern is transferred to the substrate, such as by appropriate etching techniques, which also removes any remaining silicon-containing layer or hardmask layer, followed by removal of any remaining patterned aromatic underlayer to provide a patterned substrate.

The cured underlayer of the present invention may also be used in a self-aligned double patterning process. In such a process, a layer of the present coating composition is coated on a substrate, such as by spin-coating. Any remaining organic solvent is removed and the coating composition layer is cured to form a cured underlayer. A suitable middle layer, such as a silicon-containing layer is coated on the cured underlayer. A layer of a suitable photoresist is then coated on the middle layer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the middle layer and the cured underlayer by appropriate etching techniques to expose portions of the substrate. Typically, the photoresist is also removed during such etching step. Next, a conformal silicon-containing layer is disposed over the patterned cured underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the patterned underlayer. Next, the silicon-containing layer is partially etched (trimmed) to expose a top surface of the patterned polyarylene resin underlayer and a portion of the substrate. Following this partial etching step, the pattern on the substrate comprises a plurality of features, each feature comprising a line or post of the cured underlayer with the silicon-containing layer directly adjacent to the sides of each cured underlayer feature. Next, the cured underlayer is removed, such as by etching, to expose the substrate surface that was under the cured underlayer pattern, and providing a patterned silicon-containing layer on the substrate surface, where such patterned silicon-containing layer is doubled (that is, twice as many lines and/or posts) as compared to the patterned cured underlayer.

The coating compositions of the invention are also useful in forming planarizing layers, gap filling layers, and protective layers in the manufacture of integrated circuits. When used as such planarizing layers, gap filling layers, or protective layers, one or more intervening material layers, such as silicon-containing layers, other aromatic resin layers, hardmask layers, and the like, are typically present between the cured layer of the present coating composition and any photoresist layer. Typically, such planarizing layers, gap filling layers, and protective layers are ultimately patterned. A gap-filling process according to the invention comprises: (a) providing a semiconductor substrate having a relief image on a surface of the substrate, the relief image comprising a plurality of gaps to be filled; (b) applying a gap-fill composition over the relief image, wherein the gap-fill composition comprises: one or more curable compounds comprising an aromatic core chosen from a $C_{5-6}$ aromatic ring and a $C_{9-30}$ fused aromatic ring system and three or more substituents of formula (1)

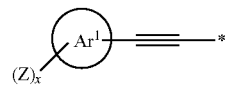

(1)

wherein at least two substituents of formula (1) are attached to the aromatic core; and wherein $Ar^1$ is an aromatic ring or fused aromatic ring system having from 5 to 30 carbons; Z is a substituent chosen from chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to 4; and * denotes the point of attachment to the aromatic core; provided that no substituents of formula (1) are in an ortho position to each other on the same ring of the aromatic core; and (ii) one or more organic solvents; and (c) heating the gap-fill composition at a temperature to cure the one or more curable compounds. The present compositions substantially fill, preferably fill, and more preferably fully fill, a plurality of gaps in a semiconductor substrate.

The compounds of the invention have good gap-filling properties. Films formed from the compounds of the invention have good planarization, solvent resistance and reduced defect formation as compared to compounds disclosed in U.S. Pat. No. 9,581,905.

Example 1. 1,3,5-Tribromobenzene (2.36 g), cuprous iodide (0.21 g) and triethylamine (3.42 g) were added to 20 g of 1,4-dioxane at room temperature. The reaction mixture was purged with nitrogen for 1 hr. Bis(triphenylphosphine) palladium(II) chloride (0.53 g) was added to the reaction mixture, and the mixture was heated to 70° C. 4-Ethynylphenyl acetate (4.81 g) was dissolved in degassed 1,4-dioxane (14 g), and the solution was then slowly added to reaction mixture by way of an addition funnel. After completion of addition, the reaction mixture was stirred for overnight at 70° C. under nitrogen. After the reaction was completed, the reaction mixture was cooled to room temperature, filtered and solvents were evaporated. The residue was purified by column chromatography to give 1,3,5-tris((4-acetoxyphenyl)ethynyl)benzene (Compound I1) as a light yellow solid, 3.5 g (84% yield). The reaction is shown in the following reaction scheme.

Reaction Scheme 1

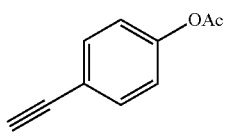

+

-continued

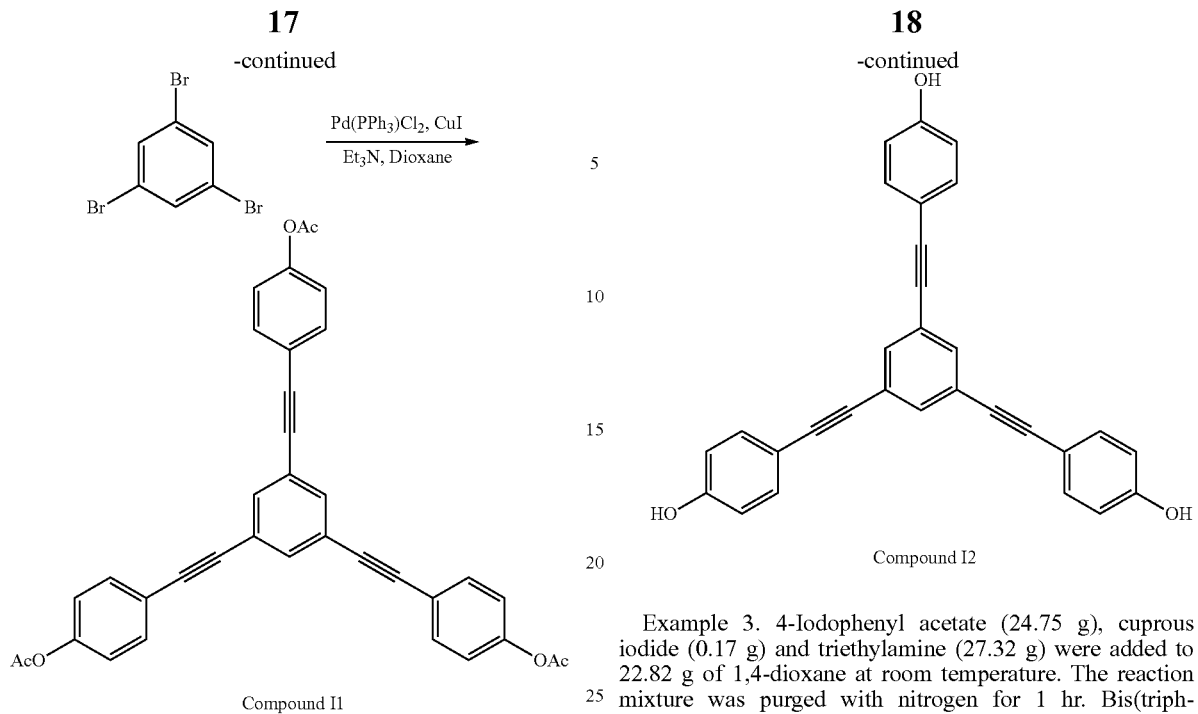

Compound I1

Example 2. 1,3,5-Tribromobenzene (2.36 g), cuprous iodide (0.21 g) and triethylamine (3.42 g) were added to 20 g of 1,4-dioxane at room temperature. The reaction mixture was purged with nitrogen for 1 hr. Bis(triphenylphosphine)palladium(II) chloride (0.53 g) was added to the reaction mixture, and the mixture was heated to 70° C. 4-Ethynylphenyl acetate (4.81 g) was dissolved in degassed 1,4-dioxane (14 g), and the solution was then slowly added to reaction mixture by way of an addition funnel. After completion of addition, the reaction mixture was stirred for overnight at 70° C. under nitrogen. After the reaction was completed, the reaction mixture was cooled to room temperature, filtered and solvents were evaporated. The residue was purified by column chromatography to give alight yellow solid. This obtained solid was then dissolved in THF (35 g) under nitrogen. Lithium hydroxide monohydrate (0.94 g) and water (8 g) were added, and the reaction mixture was stirred at 60° C. for 1 hr. The reaction mixture was then diluted with ethyl acetate and then treated with hydrochloric acid until the pH of the aqueous layer was 1. The organic phase was separated and the aqueous phase was extracted with ethyl acetate. The organic layers were combined, and washed with water. The solvent was removed under vacuum to obtain 1,3,5-tris((4-hydroxyphenyl)ethynyl)benzene (Compound I2) as a light yellow solid, 2.6 g (81% yield). The reaction is shown in the following reaction scheme.

-continued

Compound I2

Example 3. 4-Iodophenyl acetate (24.75 g), cuprous iodide (0.17 g) and triethylamine (27.32 g) were added to 22.82 g of 1,4-dioxane at room temperature. The reaction mixture was purged with nitrogen for 1 hr. Bis(triphenylphosphine)palladium(II) chloride (0.63 g) was added to the reaction mixture, and the mixture was heated to 70° C. A solution of 1,3,5-triethynylbenzene (4.5 g) in degassed 1,4-dioxane (20 g) was then slowly added to reaction mixture via syringe pump. After completion of addition, the reaction was stirred for overnight at 70° C. under nitrogen. After the reaction was completed, the reaction mixture was cooled to room temperature, and solvents were evaporated. The residue was diluted with ethyl acetate and filtered to remove the solid. The solution was evaporated, and the residue was purified by column chromatography to give a light yellow solid. This obtained solid was then dissolved in THF (38 g) under nitrogen. Lithium hydroxide monohydrate (3.81 g) and water (16 g) were added, and the mixture was stirred at 60° C. for 1 hr. The mixture was then cooled to room temperature, and the solvent was removed. The residue was diluted with ethyl acetate and water, and then treated with hydrochloric acid until the pH of the aqueous layer was 1. The organic phase was separated and the aqueous phase was extracted with ethyl acetate. The organic layers were combined, and washed with water. The solvent was removed under vacuum, and the residue was purified by column chromatography to obtain 1,3,5-tris((4-hydroxyphenyl)ethynyl)benzene (Compound I2) as a light yellow solid, 7.7 g (61% yield). The reaction is shown in the following reaction scheme.

Reaction Scheme 2

Reaction Scheme 3

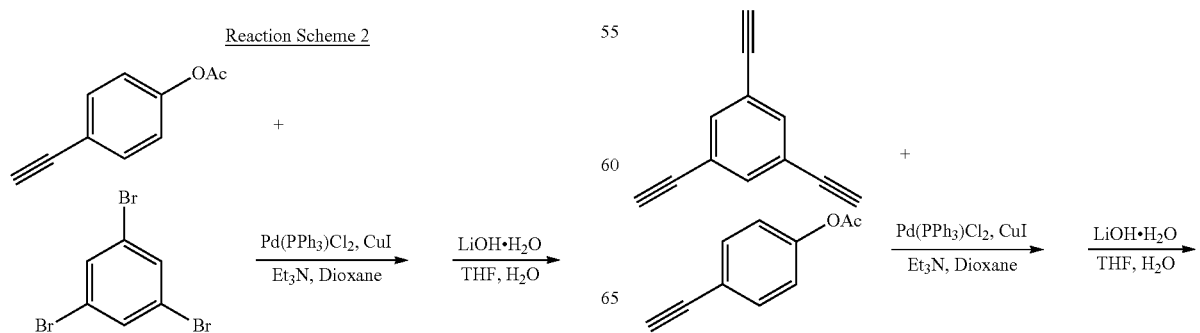

-continued

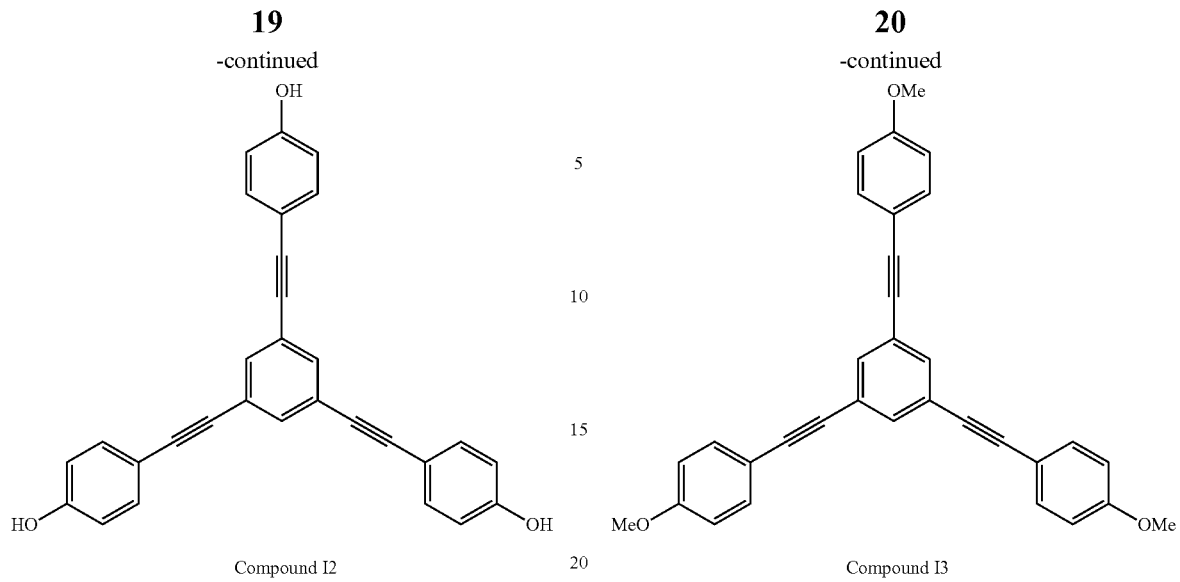

Compound I2

Compound I3

Example 4. 1,3,5-Tribromobenzene (3.12 g), cuprous iodide (0.29 g) and triethylamine (4.55 g) were added to 22 g of 1,4-dioxane at room temperature. The reaction mixture was purged with nitrogen for 1 hr. Bis(triphenylphosphine) palladium(II) chloride (0.70 g) was added to the reaction mixture, and the mixture was heated to 70° C. 1-ethynyl-4-methoxybenzene (5.28 g) was dissolved in degassed 1,4-dioxane (20 g), and the solution was then slowly added to reaction mixture by way of an addition funnel. After completion of addition, the reaction mixture was stirred overnight at 70° C. under nitrogen. After reaction was completed, the mixture was cooled to room temperature, filtered and solvents were evaporated. The residue was purified by column chromatography to give 1,3,5-tris((4-methoxyphenyl)ethynyl)benzene (Compound I3) as a light yellow solid, 4.0 g (85% yield). The reaction is shown in the following reaction scheme.

Example 5. 1,3,5-Tribromobenzene (3.12 g), cuprous iodide (0.29 g) and triethylamine (4.55 g) were added to 22 g of 1,4-dioxane at room temperature. The reaction mixture was purged with nitrogen for 1 hr. Bis(triphenylphosphine) palladium(II) chloride (0.70 g) was added to the reaction mixture, and the mixture was heated to 70° C. 4-Ethynylaniline (4.68 g) was dissolved in degassed 1,4-dioxane (20 g), and the solution was then slowly added to the reaction mixture by way of an addition funnel. After completion of addition, the reaction mixture was stirred overnight at 70° C. under nitrogen. After the reaction was completed, the reaction mixture was cooled to room temperature, filtered and solvents were evaporated. The residue was purified by column chromatography to give 1,3,5-tris((4-aminophenyl)ethynyl)benzene (Compound I4) as a yellow solid, 1.5 g (36% yield). The reaction is shown in the following reaction scheme.

Reaction Scheme 4

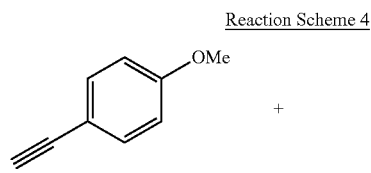

Reaction Scheme 5

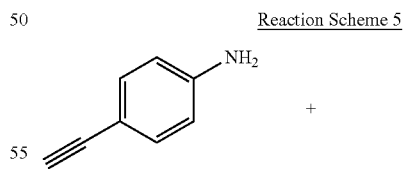

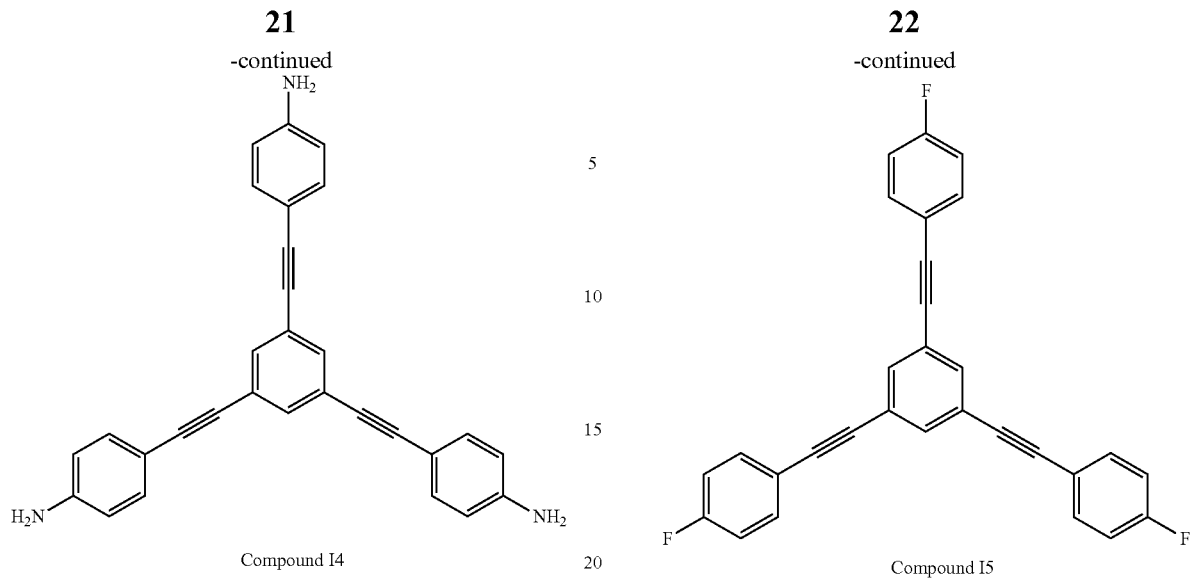

Compound I4

Compound I5

Example 6. 1,3,5-Tribromobenzene (15.0 g) was added to 40.0 g of 1,4-dioxane at room temperature to yield a clear solution. Triethylamine (14.5 g) and cuprous iodide (0.91 g) were added to the reaction mixture. The reaction mixture was purged with nitrogen for 1 hr. Bis(triphenylphosphine)palladium(II) chloride (1.00 g) was added to the reaction mixture. Next, 22.9 g of 4-fluorophenylacetylene was slowly added to reaction mixture via an addition funnel. After completion of addition, the reaction was stirred for 24 hr. at 55° C. under nitrogen. The reaction mixture was filtered and solvents were evaporated. The residue was dissolved in heptanes and filtered through a silica plug. After filtration, the solvents were removed to yield 1,3,5-tris((4-fluorophenyl)ethynyl)benzene (Compound I5) as a light yellow solid (8.0 g) in 39% yield. The reaction is shown in the following reaction scheme.

Example 7. 5,5'-Oxybis(1,3-dibromobenzene) (3.61 g), cuprous iodide (0.21 g) and triethylamine (3.42 g) were added to 20 g of 1,4-dioxane at room temperature. The reaction mixture was purged with nitrogen for 1 hr. Bis(triphenylphosphine)palladium(II) chloride (0.53 g) was added to the reaction mixture, and the mixture was heated to 70° C. 4-Ethynylphenyl acetate (4.81 g) was dissolved in degassed 1,4-dioxane (17 g), and the solution was then slowly added to reaction mixture by way of an addition funnel. After completion of addition, the reaction mixture was stirred overnight at 70° C. under nitrogen. After the reaction was completed, the reaction mixture was cooled to room temperature, filtered and solvents were evaporated. The residue was purified by chromatography to give a light yellow solid. This obtained solid was then dissolved in THF (40 g) under nitrogen. Lithium hydroxide monohydrate (1.26 g) and water (10 g) were added, and the mixture was stirred at 60° C. for 1 hr. The reaction mixture was then diluted with ethyl acetate and then treated with hydrochloric acid until the pH of the aqueous layer was 1. The organic phase was separated and the aqueous phase was extracted with ethyl acetate. The organic layers were combined, and washed with water. The solvent was removed under vacuum, and the residue was purified by column chromatography to give 5,5'-oxybis(1,3-di((4-hydroxyphenyl)ethynyl)benzene) (Compound I6) as a light yellow solid, 3.1 g (65% yield). The reaction is shown in the following reaction scheme.

Reaction Scheme 6

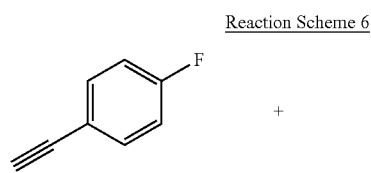

Reaction Scheme 7

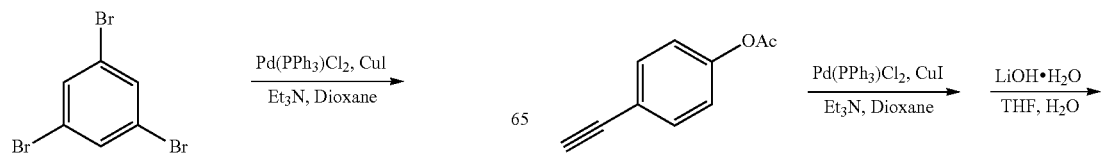

-continued

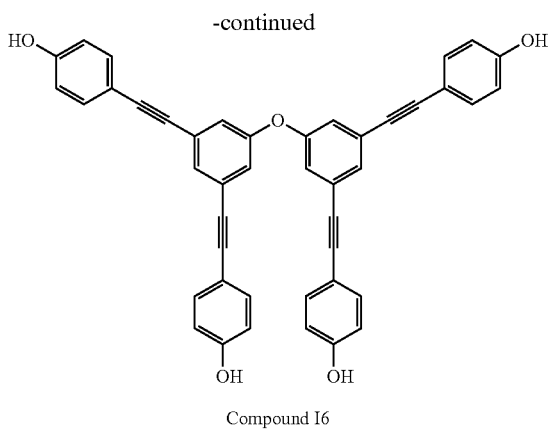

Compound I6

Example 8. 9,9-Bis(6-(3,5-dibromophenoxy)naphthalen-2-yl)-9H-fluorene (6.85 g), cuprous iodide (0.21 g) and triethylamine (3.42 g) were added to 25 g of 1,4-dioxane at room temperature. The reaction mixture was purged with nitrogen for 1 hr. Bis(triphenylphosphine)palladium(II) chloride (0.53 g) was added to the reaction mixture, and the mixture was heated to 70° C. 4-Ethynylphenyl acetate (4.81 g) was dissolved in degassed 1,4-dioxane (22 g), and the solution was then slowly added to reaction mixture by way of an addition funnel. After completion of addition, the reaction mixture was stirred overnight at 70° C. under nitrogen. After the reaction was completed, the reaction mixture was cooled to room temperature, filtered and solvents were evaporated. The residue was purified by chromatography to give a light yellow solid. This obtained solid was then dissolved in THF (40 g) under nitrogen. Lithium hydroxide monohydrate (1.26 g) and water (10 g) were added, and the mixture was stirred at 60° C. for 1 hr. The reaction mixture was then diluted with ethyl acetate and then treated with hydrochloric acid until the pH of the aqueous layer was 1. The organic phase was separated and the aqueous phase was extracted with ethyl acetate. The organic layers were combined, and washed with water. The solvent was removed under vacuum, and the residue was purified by column chromatography to give 9,9-bis(6-(3,5-di((4-hydroxyphenyl)ethynyl)phenoxy)naphthalen-2-yl)-9H-fluorene (Compound I7) as a light yellow solid, 4.7 g (59% yield). The reaction is shown in the following reaction scheme.

Reaction Scheme 8

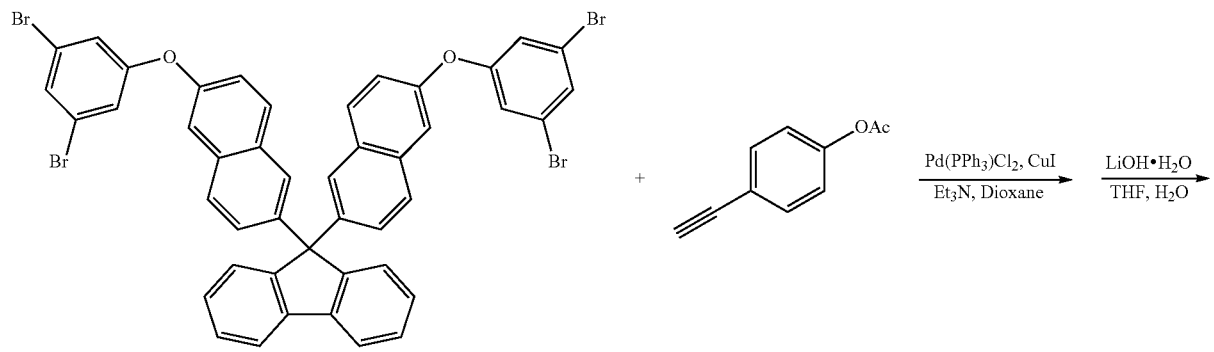

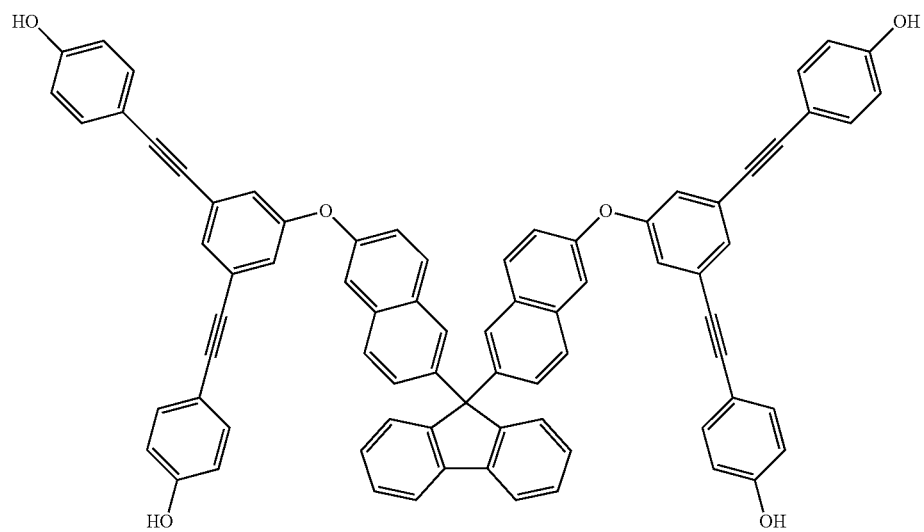

Compound I7

Example 9. 1,3,5-Trisbromobenzene (2.83 g), cuprous iodide (0.17 g) and triethylamine (4.10 g) were added to 20 g of 1,4-dioxane at room temperature. The reaction mixture was purged with nitrogen for 1 hr. Bis(triphenylphosphine) palladium(II) chloride (0.32 g) was added to the reaction mixture, and the mixture was heated to 70° C. 2-((6-Ethynylnaphthalen-2-yl)oxy)tetrahydro-2H-pyran (6.81 g) was dissolved in degassed 1,4-dioxane (13 g), and the solution was then slowly added to reaction mixture by way of an addition funnel. After completion of addition, the reaction mixture was stirred overnight at 70° C. under nitrogen. After the reaction was completed, the reaction mixture was cooled to room temperature, filtered and solvents were evaporated. The residue was purified by chromatography to give white solid. This obtained solid was then dispersed in MeOH (54 g) under nitrogen. 12N HCl (4.5 g) and water (54 g) were added, and the mixture was refluxed overnight at 60° C. The reaction mixture was then cooled to room temperature, and solvent was removed under vacuum. The residue was diluted with ethyl acetate, and the organic phase was separated and the aqueous phase was extracted with ethyl acetate. The organic layers were combined, and washed with water. The solvent was removed under vacuum, and the residue was purified by column chromatography to give 1,3,5-tris((2-hydroxynaphthyl-6-ethynyl)benzene (Compound I8) as a white solid 1.1 g (21% yield). The reaction is shown in the following reaction scheme.

Reaction Scheme 9

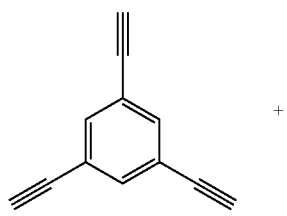

+

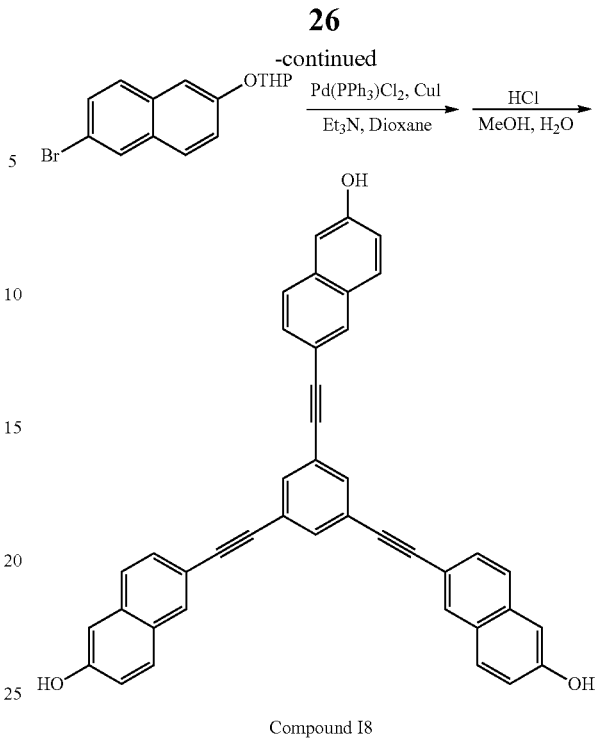

Compound I8

Compound I2 (6.0 g) in 46 g anhydrous DMF was stirred at room temperature for 15 minutes. The mixture was heated to 30° C. and 10.34 g $K_2CO_3$ was then added. The reaction was then allowed to heat to 50° C. and 8.63 g propargyl bromide (80% in toluene) solution was added dropwise via additional funnel. The reaction mixture was heated at 50° C. for 24 hours. The reaction was then allowed to cool down to room temperature and was filtered to remove most of $K_2CO_3$. The organic was precipitated into 2 L water, stirred at room temperature for 0.5 h. The precipitated polymer was collected by filtration to give solid (17.8 g) after dried under vacuum at 35° C. for 1 day.

Reaction Scheme 10

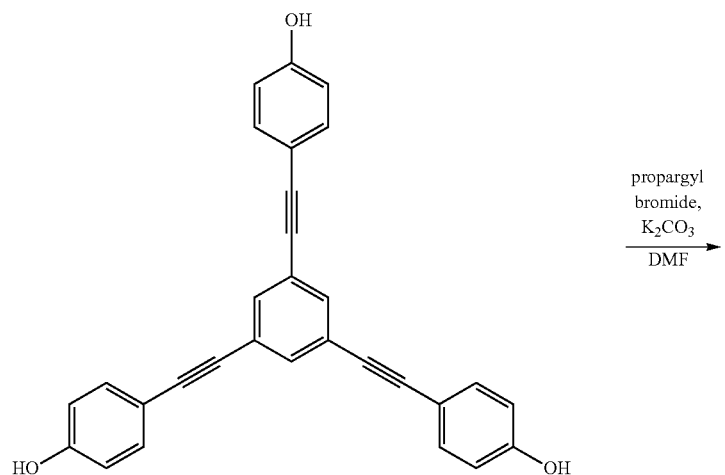

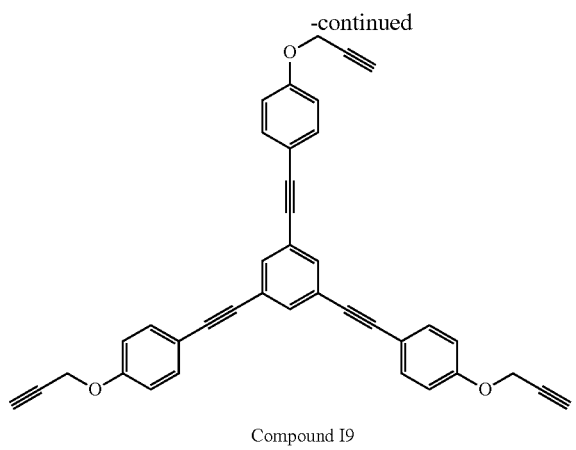

Compound I9

Comparative Example 1. 1,3,5-Tris(4-bromophenyl)benzene (4.05 g), cuprous iodide (0.21 g) and triethylamine (3.42 g) were added to 20 g of 1,4-dioxane at room temperature. The reaction mixture was purged with nitrogen for 1 hr. Bis(triphenylphosphine)palladium(II) chloride (0.53 g) was added to the reaction mixture, and the mixture was heated to 70° C. 4-Ethynylphenyl acetate (4.81 g) was dissolved in degassed 1,4-dioxane (14 g), and the solution was then slowly added to reaction mixture by way of an addition funnel. After completion of addition, the reaction mixture was stirred overnight at 70° C. under nitrogen. After the reaction was completed, the reaction mixture was cooled to room temperature, filtered and solvents were evaporated. The residue was purified by chromatography to give a light yellow solid. This obtained solid was then dissolved in THF (35 g) under nitrogen. Lithium hydroxy monohydrate (0.94 g) and water (8 g) were added, and the mixture was stirred at 60° C. for 1 hr. The reaction mixture was then diluted with ethyl acetate and then treated with hydrochloric acid until the pH of the aqueous layer was 1. The organic phase was separated and aqueous phase was extracted with ethyl acetate. The organic layers were combined, and washed with water. The solvent was removed under vacuum, and the residue was purified by column chromatography to give 1,3,5-tris((4-(4-hydroxyphenyl)ethynyl)phenyl)benzene (Comparative 1) as a light yellow solid, 2.2 g (44% yield). The reaction is shown in the following reaction scheme.

Reaction Scheme 10

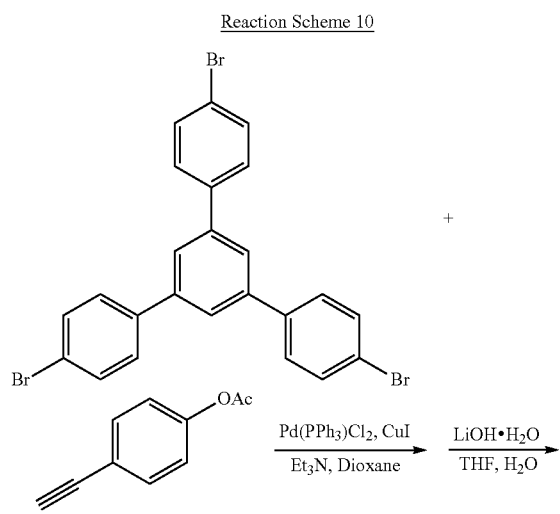

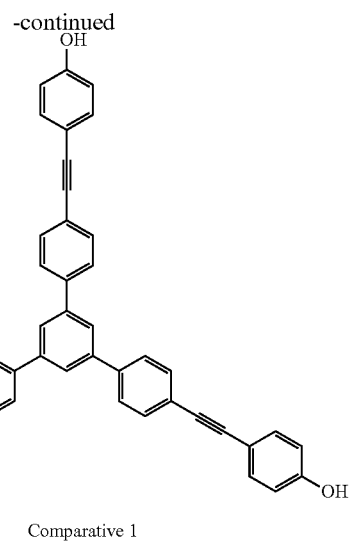

Comparative 1

Example 10. Solubility was evaluated by mixing a compound of the invention with each of PGME and PGMEA at 5% solids. Those mixtures were visibly inspected as well as checked using a turbidity meter (Orbeco-Hellige Co). If the turbidity value was less than 1, the compound was rated soluble ("S") and if the turbidity value was greater than 1, it was rated not soluble ("NS"). The results are reported in Table 1. As can be seen from these data, the compounds of the invention and the Comparative compound are all soluble in each of PGME and PGMEA.

TABLE 1

| Entry No. | Compound | Solubility (5% solids) | |
| --- | --- | --- | --- |
| | | PGMEA | PGME |
| 1 | I2 | S | S |
| 2 | I6 | S | S |
| 3 | I9 | S | S |
| 4 | Comparative 1 | S | S |

Example 11. Thermal stability of compounds of the invention was evaluated using a Thermal Gravimetric Analyzer (TGA) Q500 from TA-Instruments, under the following conditions: under $N_2$, ramp at 10° C./min. to 700° C.;

and under air, ramp at 10° C./min. to 700° C. The temperature at which the materials lost 5% of their weight ("$Td_{5\%}$") are reported in Table 2.

TABLE 2

| Entry | | $Td_{5\%}$ (° C.) | |
|---|---|---|---|
| No. | Compound | Under $N_2$ | Under Air |
| 1 | I2 | 504 | 470 |
| 2 | I6 | 503 | 469 |
| 3 | I9 | 471 | 398 |
| 4 | Comparative 1 | 526 | 492 |

Example 12. Solvent strip resistance was measured as an indication of film crosslinking. Compositions of compounds of the invention and of Comparative Compound 1 were prepared in a mixture of PGMEA and benzyl benzoate at 4.5% solids. Each composition was spin-coated on an 8" (200 mm) silicon wafer at a rate of 1500 rpm using ACT-8 Clean Track (Tokyo Electron Co.), and then baked at the temperature reported in Table 3 for 60 seconds to form a film. Initial film thickness was measured using an OptiProbe™ from Therma-Wave Co. Next, a commercial remover, OK73 (PGME/PGMEA=70/30), was applied to each of the films for 90 seconds followed by a post strip baking step at 105° C. for 60 seconds. The thickness of each film following post strip baking was again measured to determine the amount of film thickness lost. The difference in film thickness before and after contact with the remover is reported in Table 3 as the percentage of film thickness remaining. As can be seen from the data, films formed from the compounds of the invention retained greater than 99% of their thickness, whereas the film formed from Comparative Compound 1 retained only 12% film thickness (that is, it lost 88% of its thickness) after contact with the remover.

TABLE 3

| Entry No. | Compound | % Film Remaining |
|---|---|---|
| 1 | I2 | >99 (230° C.) |
| 2 | I6 | >99 (230° C.) |
| 3 | I9 | >99 (300° C.) |
| 4 | Comparative 1 | 12 (230° C.) |

Example 13. Compositions of compounds of the invention and of Comparative Compound 1 were prepared in a mixture of PGMEA and benzyl benzoate at 4.5% solids. Each composition was spin-coated on an 8" (200 mm) silicon wafer at a rate of 1500 rpm using ACT-8 Clean Track (Tokyo Electron Co.), and then baked at the temperatures identified in Table 4 for 60 seconds to form a cured film. Optical constants were measured by Vacuum Ultra-Violet Variable Angle Ellipsometer (VUV-VASE, from Woollam Co.) at 193 nm, and are reported in Table 4.

TABLE 4

| Entry | Compound | Refractive Index/Absorbance at 193 nm | |
|---|---|---|---|
| No. | (Temperature) | n | k |
| 1 | I2 (240° C.) | 1.41 | 0.25 |
| 2 | I9 (300° C.) | 1.49 | 0.50 |
| 3 | Comparative 1 (300° C.) | 1.42 | 0.63 |

Example 14. Compounds of the invention were evaluated to determine their gap-filling properties. Gap fill templates were created at CNSE Nano-FAB (Albany, NY). The template had $SiO_2$ film thickness of 100 nm, and various pitch and patterns. The template coupons were baked at 150° C. for 60 seconds as a dehydration bake prior to coating the coupons with the present compositions. Each coating composition (4.5% solids in a mixture of PGMEA, benzyl benzoate and PolyFox PF656) was coated on a template coupon using an ACT-8 Clean Track (Tokyo Electron Co.) spin coater and a spin rate of 1500 rpm+/−200 rpm. The target film thickness was 100 nm after curing, and the composition dilution was adjusted accordingly to give approximately the target film thickness after curing. The films were cured by placing the wafer on a hot plate at the temperature identified in Table 5 for 60 sec. Cross-section scanning electron microscope (SEM) images of the coated coupons were collected using a Hitachi S4800 SEM (from Hitachi High Technologies). Planarization quality of the films was obtained from the SEM images using Hitachi offline CD measurement software or CDM software by measuring the difference in thickness between dense trench and open area of the film (ΔFT). Films having a ΔFT<20 nm were considered to have "Good" planarization and films having a ΔFT>20 nm were considered to have "Poor" planarization. Gap filling was evaluated by visually inspecting the SEM images to see if there were any voids or bubbles in the trench patterns. Films having no voids in the trench patterns were considered to have "Good" gap fill and films having voids in the trench patters were considered to have "Poor" gap fill. These results are reported in Table 5.

TABLE 5

| Sample No. | Compound (Temperature) | Planarization | Gap Fill |
|---|---|---|---|
| 1 | I2 (240° C.) | Good | Good |
| 2 | I6 (240° C.) | Good | Good |
| 3 | I8 (300° C.) | Good | Good |
| 4 | I9 (300° C.) | Good | Good |
| 5 | Comparative 1 (300° C.) | Poor | Good |

Example 15. Compositions of compounds of the invention and of Comparative Compound 1 were prepared in PGMEA at 4.5% solids. Each composition was spin-coated on an 8" (200 mm) silicon wafer at a rate of 1500 rpm using an ACT-8 Clean Track (Tokyo Electron Co.), and then baked at the temperatures reported in Table 6 for 60 sec. to form a cured film. Coating quality was evaluated by visually inspecting the film, and the results are reported in Table 6.

TABLE 6

| Entry No. | Compound (Temperature) | Coating Quality |
|---|---|---|
| 1 | I2 (240° C.) | Good |
| 2 | I9 (300° C.) | Good |
| 3 | Comparative 1 (300° C.) | Poor |

Example 16. Each underlayer solution (4.5% solids in a mixture of PGMEA and benzyl benzoate) was spin coated at 1500 rpm on 200 mm silicon wafers using an ACT-8 Clean Track with targeted film thickness of 100 nm after curing. A virgin silicon wafer was placed upside down on top of the coated wafer with three (2 mm) spacers on the edge. The wafer stack was baked at the temperatures identified in Table 7 for 60 sec. on a hot plate with the coated wafer at the bottom. The top wafer was inspected for haze (which indicates sublimation) and defect using SP2 defect tool (from KLA-Tencor Corporation) with 500 nm sensitivity. As can be seen from the data in Table 7, Comparative Compound 1 gives significantly higher defect count and defect density than does Compound I2 of the present invention.

TABLE 7

| Entry No. | Compound (Temperature) | Sublimation Defect (Less spacer defects) | |
|---|---|---|---|
| | | Defect Count | Defect Density |
| 1 | I2 (240° C.) | <8 | <0.03 |
| 2 | Comparative 1 (300° C.) | >91000 | >325 |

What is claimed is:

1. A method comprising: (a) providing an electronic device substrate; (b) coating a layer of a coating composition comprising one or more curable compounds on a surface of the electronic device substrate, wherein the one or more curable compounds comprise an aromatic core chosen from a $C_{5-6}$ aromatic ring and a $C_{9-30}$ fused aromatic ring system and three or more substituents of formula (1)

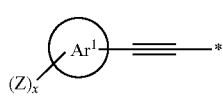

(1)

wherein at least two substituents of formula (1) are attached to the aromatic core; and wherein $Ar^1$ is an aromatic ring or fused aromatic ring system having from 5 to 30 carbons; Z is a substituent chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to 4; and * denotes the point of attachment to the aromatic core; wherein $Ar^1$ is not further substituted beyond the Z substituent(s) and the alkyne-containing substituent; provided that no substituents of formula (1) are in an ortho position to each other on the same ring of the aromatic core; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate.

2. The method of claim 1 further comprising the steps of patterning the substrate; and then removing the patterned underlayer.

3. The method of claim 1 further comprising the step of coating one or more of a silicon-containing layer, an organic antireflective coating layer and a combination thereof over the underlayer before step (d).

4. The method of claim 3 further comprising the step of transferring the pattern to the one or more of the silicon-containing layer, the organic antireflective coating layer and the combination thereof after step (f) and before step (g).

5. The method of claim 1 wherein each Z is independently chosen from $OR^1$, protected hydroxyl, carboxyl, protected carboxyl, SH, fluorine and $NR^2$.

6. The method of claim 1 wherein aromatic core is chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene.

7. The method of claim 1 wherein each $Ar^1$ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene.

8. The method of claim 1 wherein the coating composition further comprises one or more of an organic solvent, a curing agent, and a surface leveling agent.

9. An electronic device comprising an electronic device substrate having a layer of a polymer comprising as polymerized units one or more curable compounds on a surface of the electronic device substrate, wherein the one or more curable compounds comprise an aromatic core chosen from a $C_{5-6}$ aromatic ring and a $C_{9-30}$ fused aromatic ring system and three or more substituents of formula (1)

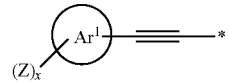

(1)

wherein at least two substituents of formula (1) are attached to the aromatic core; and wherein $Ar^1$ is an aromatic ring or fused aromatic ring system having from 5 to 30 carbons; Z is a substituent chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$-$R^1$; x is an integer from 1 to 4; and * denotes the point of attachment to the aromatic core; wherein $Ar^1$ is not further substituted beyond the Z substituent(s) and the alkyne-containing substituent; provided that no substituents of formula (1) are in an ortho position to each other on the same ring of the aromatic core.

10. The method of claim 5 wherein each Z is OH.

11. The method of claim 1 wherein each $Ar^1$ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene.

12. The method of claim 11 wherein each $Ar^1$ is benzene.

13. The method of claim 12 wherein each Z is OH.

* * * * *